United States Patent [19]
Naitoh

[11] Patent Number: 5,448,683
[45] Date of Patent: Sep. 5, 1995

[54] SPEECH ENCODER
[75] Inventor: Masashi Naitoh, Sendai, Japan
[73] Assignee: Kokusai Electric Co., Ltd., Tokyo, Japan
[21] Appl. No.: 114,109
[22] Filed: Aug. 30, 1993

Related U.S. Application Data
[63] Continuation of Ser. No. 720,268, Jun. 24, 1991, abandoned.

[51] Int. Cl.[6] ............................................. G10L 9/00
[52] U.S. Cl. .................................................. 395/2.12
[58] Field of Search ................................ 381/29–51; 395/2.12–2.13, 2.2–2.29, 2.35–2.37

[56] References Cited

U.S. PATENT DOCUMENTS

| | | | |
|---|---|---|---|
| 4,518,950 | 5/1985 | Petr | 340/347 |
| 4,626,828 | 12/1986 | Nishitani | 340/347 |
| 5,012,517 | 4/1991 | Wilson et al. | 381/31 |
| 5,089,818 | 2/1992 | Mahieux et al. | 341/76 |
| 5,093,863 | 3/1992 | Galand et al. | 381/38 |
| 5,206,884 | 4/1993 | Bhaskar | 381/31 X |

Primary Examiner—Allen R. MacDonald
Assistant Examiner—Michelle Doerrler
Attorney, Agent, or Firm—Emmanuel J. Lobato

[57] ABSTRACT

A speech encoder circuit of a waveform coding system. An analog speech input signal having coded data therein is received by a buffer and split into two branches. In a first branch the input signal is applied to a subtractor of an adaptive predictor to obtain a predicted residual signal subjected to an orthogonal transformation in a discrete cosine transform unit to convert the residual signal into a frequency domain of each of the frames of the individual blocks. An adaptive encoder in the first branch quantizes the frequency domain frame and branches its digital coded output to a branch for output to a transmission line and to a decoding branch. In the second branch of the split input signal a first sample delay element delays the split input signal for a given number of samples and a first attenuator in the second branch delays the output of the first sample delay element a given amount of each frame received for application to the subtractor for obtaining the predicted residual signal. The coded signal in the decoding branch is applied to an adaptive decoder whose decoded output is subjected to an inverse orthogonal transformation by an inverse discrete cosine transform unit to obtain a signal applied to an input of an adder and delayed by a second delay element and attenuated by a second attenuator in the decoding branch with which processing of one frame ends. The outputs of the attenuators are applied to the subtractor for development of the predicted residual signal.

2 Claims, 5 Drawing Sheets

SPEECH ENCODER

This is a continuation of application Ser. No. 07/720,268, filed Jun. 24, 1991, now abandoned.

DETAILED DESCRIPTION OF THE INVENTION

1. Technical Field of the Invention

The present invention relates to a speech encoder of a waveform coding system which is one of speech signal coding systems and, more particularly, to a speech encoder of an adaptive transform coding (ATC) system.

2. Prior Art and Its Problem

In an adaptive transform coding (hereinafter referred to simply as ATC) system which is a kind of speech signal waveform coding system, a speech signal is divided into blocks (or frames) of 16 to 32 msec and is orthogonal-transformed to a frequency domain for each block and the resulting coefficient of transformation is adaptively quantized for transmission. For this orthogonal transformation a discrete cosine transform technique, commonly referred to simply as DCT, is employed.

BRIEF DESCRIPTION OF THE DRAWINGS

FIG. 1 shows in block form circuits of a conventional encoder 7 and decoder 8 of the above-mentioned ATC system. In FIG. 1 a speech signal input into the encoder 7 is applied via a buffer 1 to a DCT unit 2, by which it is orthogonal-transformed to a frequency region for each block to obtain a DCT coefficient (2).

Figure 1:
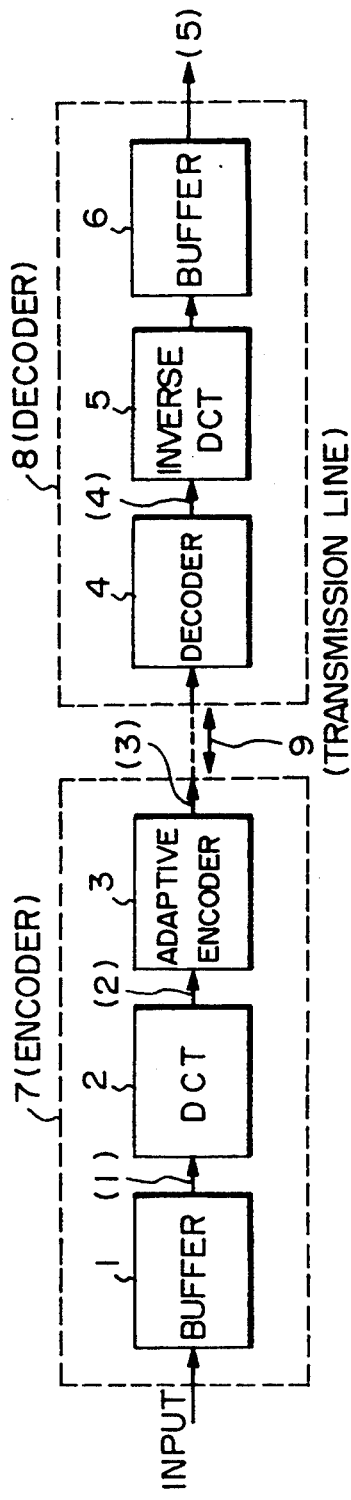
FIG. 1, is a block diagram of a prior art example.

The DCT coefficient (2) is adaptively encoded by an adaptive encoder 3 in a manner to reduce distortion and is transmitted, as digital data (3) having a coding rate (or quantization bit number) of about 16 kbps, over a transmission line 9.

In the decoder 8 the digital data (3) thus transmitted thereto is decoded by a decoding unit 4 to obtain a DCT coefficient (4), which is subjected to an inverse transformation by an inverse DCT unit 5 to obtain a synthesized or composite speech for each block, which is provided as a speech signal (5) via a buffer 6.

Letting the analog speech input signal be represented by x(n), transform equations for the DCT unit which performs the orthogonal transformation from the time domain to the frequency domain for each block and the inverse DCT unit which performs the inverse transformation are given as follows:

(1) In the case of the DCT:
A DCT coefficient Xc(k) to be obtained is $$Xc(k) = \sum_{n=0}^{N-1} x(n)g(k)\cos\left[\frac{(2n+1)\pi k}{2N}\right] \quad (1)$$

where N is the number of samples per block, $$g(k) = 1 \ (k = 0)$$

$$g(k) = \sqrt{2} \ (k = 1, 2, \ldots, N-1)$$

(2) In the case of the inverse DCT:
An analog signal x(n) to be restored is $$x(n) = \frac{1}{N}\sum_{k=0}^{N-1} Xc(k)g(k)\cos\left[\frac{(2n+1)\pi k}{2N}\right] \quad (2)$$

With the circuit arrangement of FIG. 1, when the coding rate in higher than 16 kbps, excellent speech quality can be attained, but the speech quality is seriously deteriorated in a case where the band is compressed and the coding rate decreases accordingly.

Figure 2:
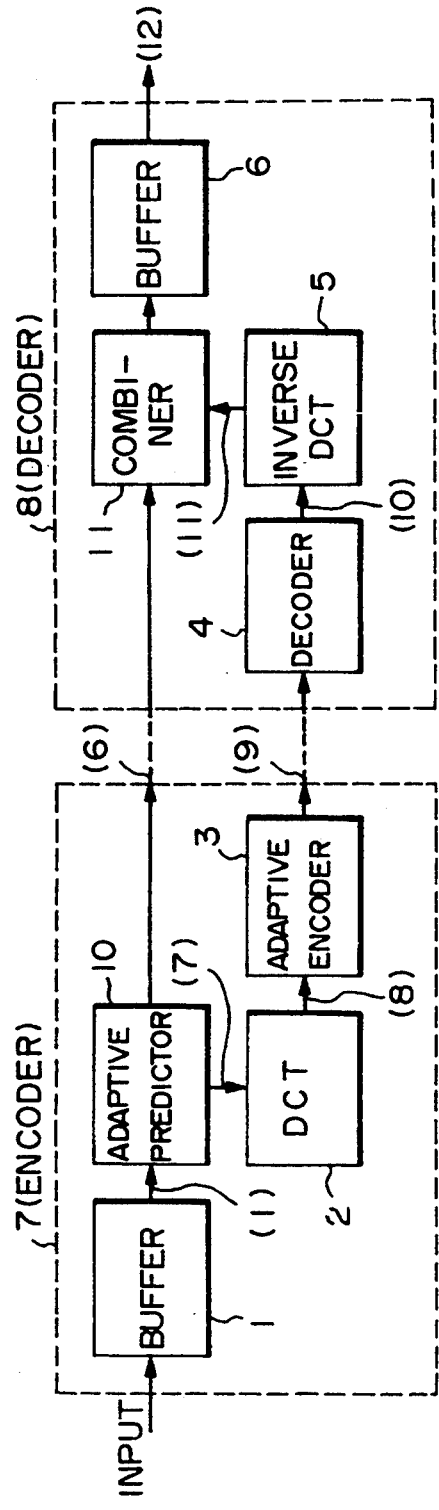
FIG. 2, is a block diagram of a conventional adaptive predicting encoder.

FIG. 2 is a block diagram showing conventional improved examples of the encoder 7 and the decoder 8. In this instance, an adaptive predictor 10 is provided between the buffer 1 and the DCT unit 2 in the encoder 7 shown in FIG. 1.

In FIG. 2 the analog speech signal input into the encoder 7 is applied via the buffer 1 to the adaptive predictor 10, which calculates an adaptive prediction coefficient for each block and provides it as digital data (6) onto the transmission line. On the other hand, a predicted residual signal output (7) obtained in the adaptive predictor 10, based on the adaptive prediction coefficient, is applied to the DCT unit 2 to obtain a DCT coefficient (8), which is encoded by the adaptive encoder 3 to a digital signal (9), which is then provided onto the transmission line, together with the above-mentioned data (6). In the decoder 8 the received signal (9) is decoded by the decoding unit (4) so that a predicted residual signal (11) is reproduced by the inverse DCT unit 5. The predicted residual signal (11) and the prediction coefficient of the received data (6) are mutually combined by a combiner 11 so that a speech signal (12) is reproduced and output via the buffer 6.

Figure 3:
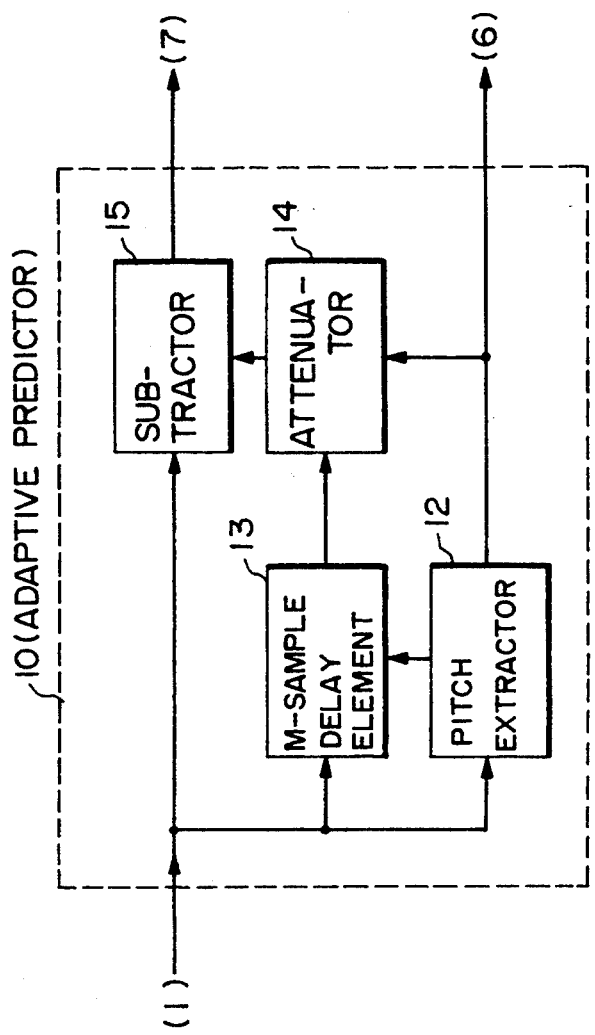
FIG. 3, is a block diagram of a detail of a part of the circuit shown in FIG. 2.

FIG. 3 illustrates the construction of a prior art example of the adaptive predictor 10, which is a long-term predictor. In FIG. 3, an analog signal X(nt) sampled by the buffer of the preceding stage is input as the input signal (1) into the adaptive predictor, and its pitch M and attenuation P are extracted by a pitch extractor 12 for each frame and provided therefrom as the data (6) onto the transmission line. On the other hand, the input signal (1) applied to an M-sample delay element 13 is delayed for an M-sample period on the basis of the speech pitch (period) provided from the pitch extractor 12, and the delayed output X((n−M)T) is applied to an attenuator 14, wherein it is multiplied by an attenuation P determined by the degree of correlation of speech which is provided from the pitch extractor 12. The attenuator output is applied to a subtractor 15, wherein it is subtracted from the input signal (1) to obtain a predicted residual signal (7), which is provided to the DCT unit 2 in FIG. 2. The predicted residual signal, if represented by ϵ(nT), can be given by the following equation:

$$e(nT) = X(nT) - P \times X((n-M)T) \quad (3)$$

Figure 4:
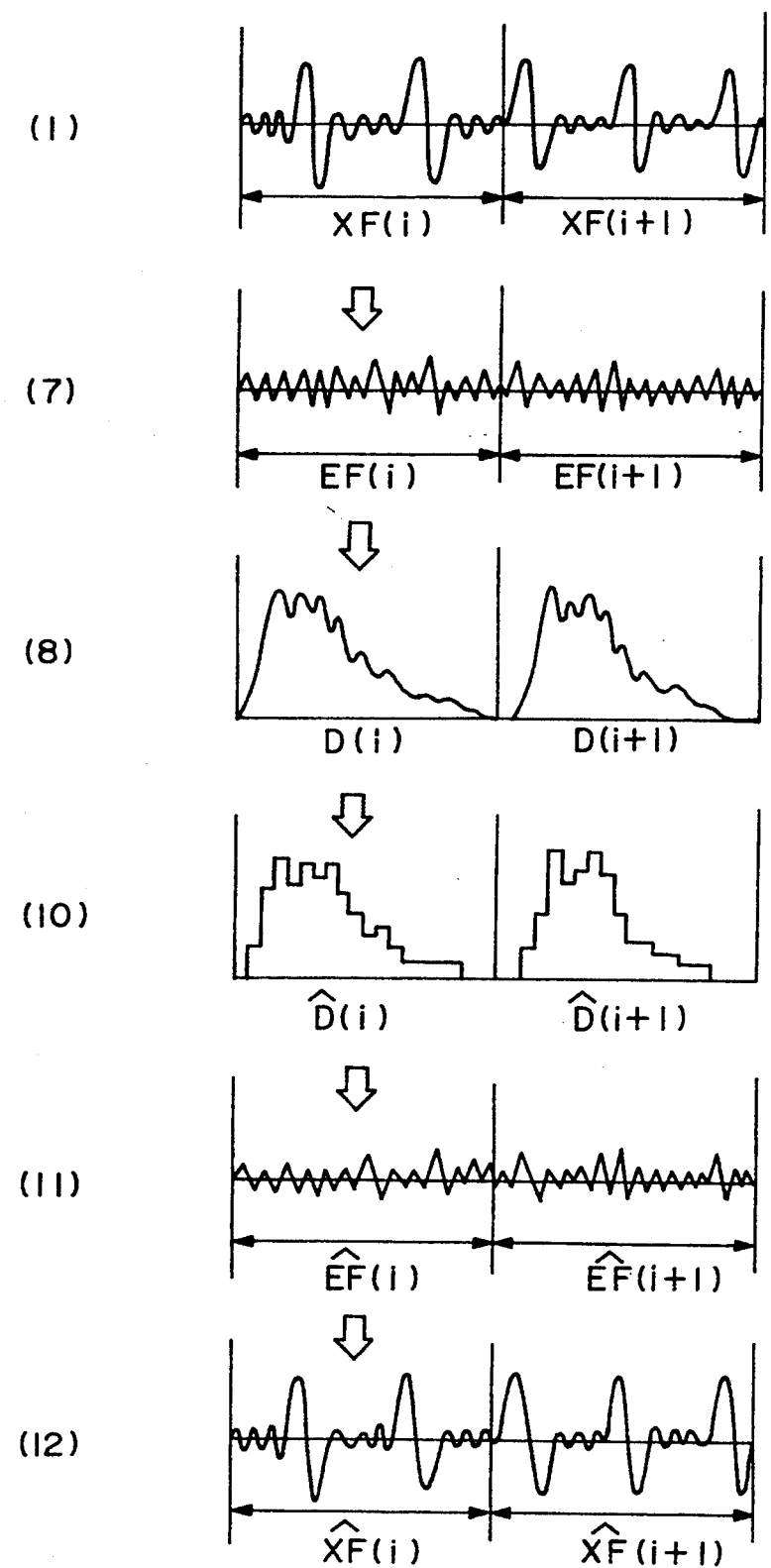
FIG. 4, is a waveform diagram of signal waveforms occurring at respective components in FIG. 2.

FIG. 4 shows waveforms occurring at respective parts in the prior art example of FIG. 2, the abscissa representing time and the ordinate amplitude. The numbers of waveform correspond to the signal numbers in FIG. 2, respectively. The time axis is shown to be divided into frames each composed of N samples. That is, the waveform (1) represents signals of i-th and (i+1)-th frames of the analog speech signal divided by the buffer of the preceding state. Consequently, the analog signal contained in the current frame is such as given by the following equation:

$$XF(i) \ldots X((N \times i + 1)T) \sim (X(N \times i + N)T)$$

EF(i) at the left-hand side in the waveform (7) is a predicted residual signal provided when the long-term predictor in FIG. 3 was used as the adaptive predictor 10 for the left-hand signal XF(i) of the waveform (1).

D(i) of the waveform (8) is a waveform resulting from the transformation of the waveform (7) by the DCT unit 2.

The waveform (10) is a waveform $\hat{D}(i)$ obtained by transmitting the waveform (8) in an adaptively encoded form and decoding it with the decoding unit of the decoder 8. By subjecting it further to inverse transformation by the inverse DCT unit 5, $\hat{EF}(i)$ of the waveform (11) is obtained By the combiner 11, $\hat{XF}(i)$ of the waveform (12) is obtained as a reproduced speech signal.

As described above, the distortion which occurs in the course of processing from the input waveform (1) to the reproduced output waveform (12) in the conventional circuit of FIG. 2 is only a quantizing distortion between the transformed waveform D(i) and the encoded and decoded waveform $\hat{D}(i)$ of the waveform (10); namely, the quality of the reproduced output speech signal (12) is influenced by this quantizing distortion alone.

Now, letting signals at a certain sample point nT be represented as follows:
Analog speech signal of the waveform (1) ... X(nT)
Adaptive predictor output of the waveform (7) ... e(nT)
Inverse DCT unit output of the waveform (11) ... ê(nT)
Combiner output of the waveform (12) ... $\hat{X}$(nT)
Pitch period ... M
Attenuation ... P then the following equations will hold:

$$e(nT) = X(nT) - P \times X((n-M)T) \quad (4)$$

$$\hat{e}(nT) = \hat{X}(nT) - P \times \hat{X}((n-M)T) \quad (5)$$

Accordingly, an error Δ(nT) between the analog speech signal X(nT) and the synthesized speech $\hat{X}$(nT) is given as follows:

$$\begin{aligned}
\Delta(nT) &= X(nT) - \hat{X}(nT) \\
&= e(nT) - \hat{e}(nT) + P \times \{X((n-M)T) - \hat{X}((n-M)T)\} \\
&= e(nT) - \hat{e}(nT) + P \times \Delta((n-M)T)
\end{aligned} \quad (6)$$

Thus, it will be seen that the error Δ(nT) is a superimposition of the quantizing distortion, e(nT) − ê(nT), of the DCT coefficient and an error Δ((n−M)T) M sample before.

Since the error Δ(nT) is based, in principle, on the quantizing distortion of the DCT coefficient, an increase of the quantizing distortion by the band compression of encoded information will abruptly deteriorate the synthesized speech quality. To produce the synthesized speech of good quality at all times, information having a coding rate of 8 to 16 kbps is needed—this poses a serious problem contradictory to the requirement for the band compression of the encoded information.

OBJECT OF THE INVENTION

It is an object of the present invention to provide a speech encoder for use in an adaptive predicting ATC system which obviates the above-mentioned problems and does not seriously deteriorates the speech quality even if the coding rate is 4.8 kbps or so.

CONSTITUTION AND FUNCTION OF THE INVENTION

The speech encoder of the present invention is characterized by the construction of the encoder in which encoded data to be transmitted is branched, decoded and input into an adaptive predictor to thereby reduce the above-noted error Δ(nT). That is to say, in order to make the error Δ((n−M)T) in Eq. (6) negligibly small, the input X((n−M)T) to the subtractor of the adaptive predictor is replaced by a signal $\hat{X}$((n−M)T) obtained by decoding the preceding frame in the encoder only when a predetermined condition is met.

With reference to the accompanying drawings, the present invention will hereinafter be described in detail.

Figure 5:
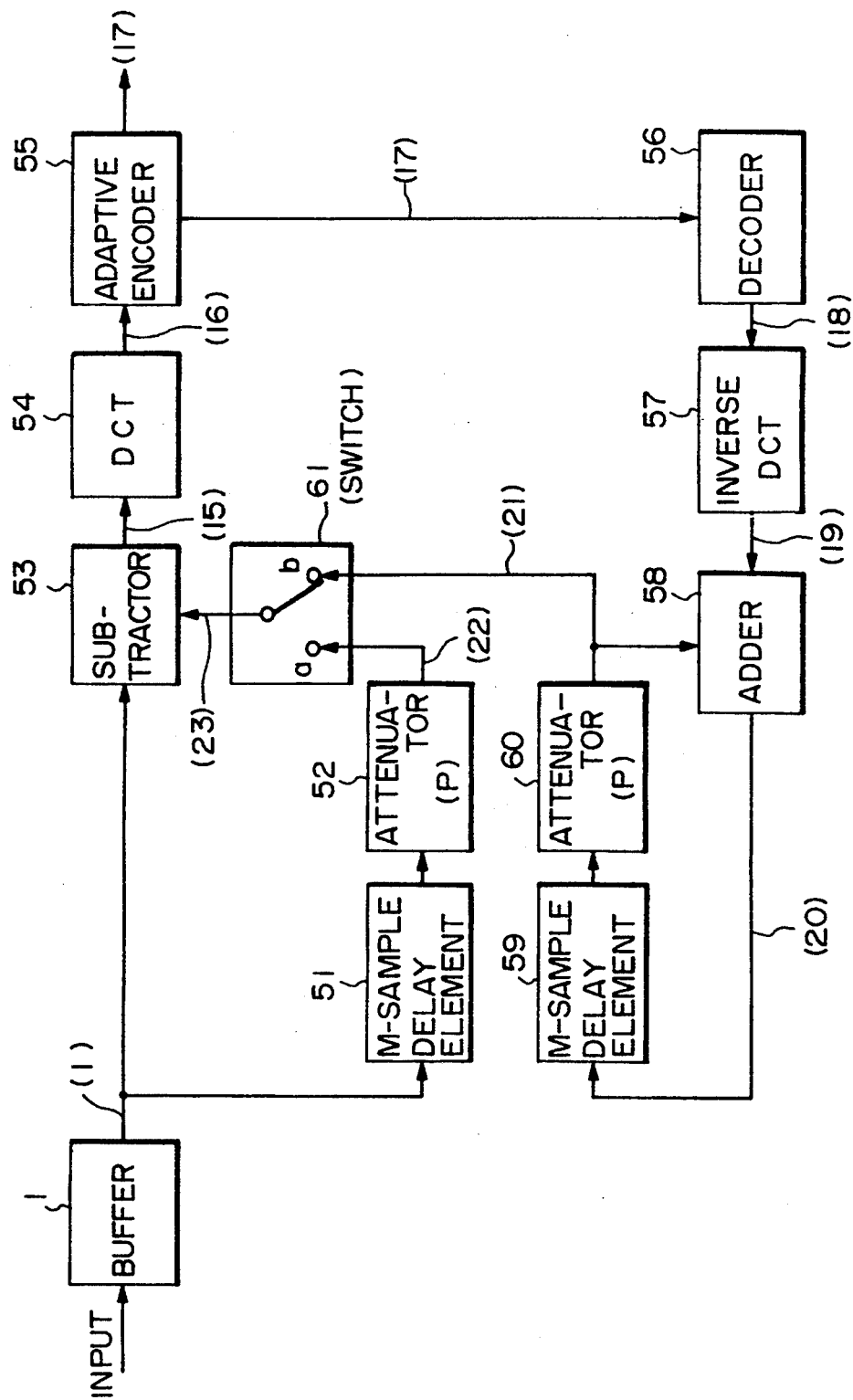
FIG. 5, is a block diagram of a circuit illustrative of an embodiment of the present invention.
Figure 6:
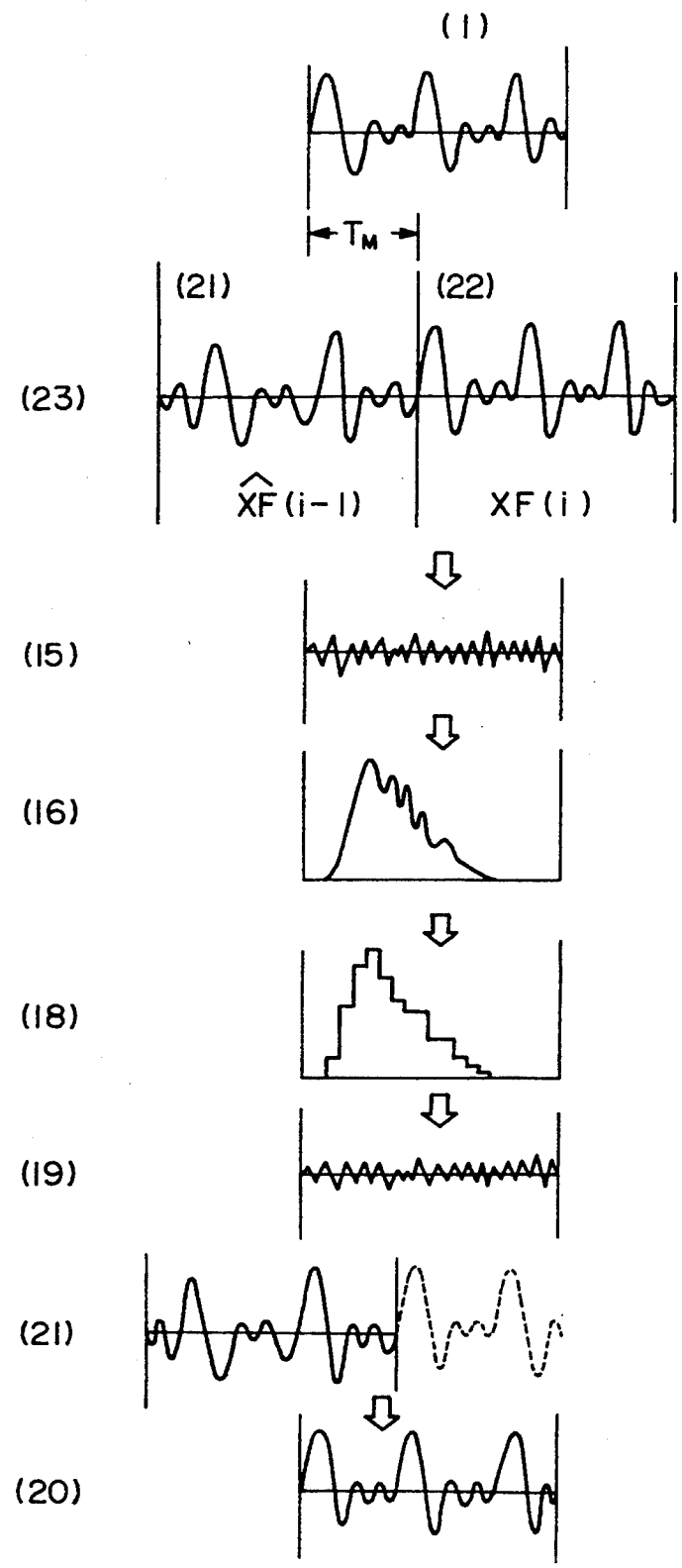
FIG. 6, is a waveform diagram of signal waveforms occurring at respective components in the circuit in FIG. 5.

FIG. 5 is a block diagram illustrating the circuit construction of an embodiment of the speech encoder according to the present invention. FIG. 6 shows waveforms occurring at respective parts in the embodiment of FIG. 5.

In FIG. 5, the input signal (1) divided by the buffer 1 into frames is transmitted over a transmission line via a subtractor 53, a DCT unit 54 and an adaptive encoder 55. Reference numeral 51 denotes an M-sample delay element, which delays the input signal (1) for M samples. The delayd output is applied to an attenuator 52 and is thereby attenuated by the amount P, thereafter being provided to a contact a of a switch 61. The M-sample delay and the attenuation P are determined for each frame when the input signal is split by the buffer 1 and they are provided to the delay element 51 and the attenuator 52.

On the other hand, the preceding frame output (17) from the adaptive encoder 55 is branched and decoded by a decoder 56, the output of which is applied via an inverse DCT unit 57 to one input terminal of an adder 58. To the other input terminal of the adder 58 is supplied its output (20) after being delayed by an M-sample delay element 59 for M samples and attenuated by an attenuator 60 by the amount P. The M-sample delay by the delay element 59 and the attenuation amount P by the attenuator 60 in this instance are values of the preceding frame. The output (21) of the attenuator 60 is connected to a contact b of the above-mentioned switch 61 and is applied to the other input of the subtractor 53 through selective switching between the contacts a and b.

In the waveform diagrams of FIG. 6, the abscissa represents time and the ordinate amplitude and the waveform numbers correspond to the numbers of the signals occurring at respective parts in the circuit of FIG. 5. FIG. 6 will he indicated in comparison with FIG. 5. The waveform (1) represents an analog input signal XF(i) of one frame which is applied to the one input of the subtractor 53.

The waveform (23) is the output of the switch 61 which is fed to the other input of the subtractor 53, and this is a continuous signal which is composed of a signal (22) resulting from the M-sample delay of the input signal (1) of the current frame by the M-sample delay element 51 and the P-amount attenuation by the attenuator 52 when the switch 61 is connected to the contact a and the signal (21) (=XF(i−1)) of the preceding frame decoded and reproduced when the switch 61 is connected to the contact b.

The M-sample delay time $T_M$ is set to be shorter than the length of one frame and the switching operation of the switch 61 is as follows: That is, when the sample point M samples (corresponding to the delay time $T_M$) before each sample point of the current frame lies within the scope of the current frame itself (22), the switch is connected to the contact a, and when the above-said sample point lies within the scope of the preceding frame (21); the switch is connected to the contact b. Thus, the output of either one of the attenuators is selectively applied to the subtractor 53, wherein it is subjected to the subtraction processing to provide a waveform (15). The waveform (15) thus obtained is a predicted residual signal EF(i).

Assuming that the pitch M of the M samples is, for example, 50, the preceding frame decoded signal $\hat{X}F(i-1)$ of the waveform (21) is used for prediction at 1st to 50th sample points in the frame of the waveform (22), i.e. the signal XF(i), and at 51st to Nth (where N is the number of samples in one frame), the signal XF(i) of the current frame is employed for prediction.

The predicted residual signal EF(i) of the waveform (15) thus obtained is rendered by the DCT unit 54 to a DCT coefficient (i.e. a waveform (16)), which is encoded by the adaptive encoder 55. At the same time, it is decoded by the decoder 56 (into a waveform (18)) and is applied to an inverse DCT unit 57 to obtain a signal $\hat{E}F(i)$ indicated by a waveform (19), which is applied to the one input of the adder 58. To the other input of the adder 58 is input a signal $\hat{E}F(i-1)$ of the preceding frame added by the adder 58 delayed by the M-sample delay element 59 and attenuated by the attenuator 60, that is, the waveform (22), with which the processing of one frame ends.

With such a constitution as described above, it is possible to reduce the error Δ((n−M) T) M samples before in the third term on the right-hand side of Eq. (6).

EFFECT OF THE INVENTION

As described above in detail, the present invention offers a speech encoder which does not seriously deteriorate the speech quality even if the coding rate is lowered to 4.8 kbps or so, and hence the invention is of great utility in practice.

I claim:

1. A speech encoder circuit for an adaptive transform coding system comprising:
a buffer for receiving and sampling an analog speech input signal into samples having frames and for splitting the speech input signal into two branches;
a substractor connected in a first branch of the two branches for receiving as one input individual one of said frames of the divided analog speech input signal to obtain therefrom a predicted residual signal;
a discrete cosine transform unit in said first branch connected to receive said residual signal from the subtractor and perform an orthogonal transform thereon to transform the residual signal into a frequency domain for each of said frames to obtain a transformation coefficient;
an adaptive encoder in said first branch receptive of the transformation coefficient as an output of the discrete cosine transform unit to quantize and encode the output of the frequency domain for each of said frames and for branching its coded output into branches for application to a transmission line and to a decoding branch;
a first sample delay element in a second branch of said two branch receptive of the split analog speech input signal from said buffer as current one of said frames of the analog speech input signal and delaying the split analog speech input signal received for a given number of samples for each of said frames;
a first attenuator receptive of the delayed analog speech input signal from said first sample delay element and attenuating by a given amount each of said frames of the received delayed analog speech input signal to obtain a first attenuated signal;
an adaptive decoder connected in the decoding branch for decoding a just preceding one of said frames of the branched coded output of said adaptive encoder to obtain a decoded digital output;
an inverse discrete cosine transform unit in the decoding branch receptive of the decoded digital output from the adaptive decoder and subjecting it to an inverse orthogonal transformation;
an adder in the decoding branch connected to the inverse discrete cosine transform unit to receive as one input an output of said inverse discrete cosine transform unit;
a second delay element in the decoding branch connected to receive an output of the adder for delaying the output of said adder by the number of delay samples corresponding to said just preceding one of said frames;
a second attenuator connected in the decoding branch for attenuating the output of said second delay element by an amount corresponding to said just preceding one of said frames to obtain a second attenuating signal and outputting the second attenuating signal as another input to said adder; and
a switch having contacts for supplying the first attenuated signal as another input of said subtractor, said contacts operable for supplying therethrough the output of said second attenuator as said another input to said subtractor in place of the output of said first attenuator only when a sample point, which precedes, by the number of delay samples of sample points in the frame to be processed by said subtractor is within the just preceding frame.

2. A speech encoder circuit for an adaptive transform coding system according to claim 1, in which said switch comprises a pair of fixed contacts connected to receive respectively outputs of said first attenuator and said second attenuator, and a movable contact operable to selectively connect alternatively said fixed contacts to said subtractor for inputting outputs of the first attenuator and of said second attenuator to said subtractor.

* * * * *